(12) United States Patent
Ishikawa et al.

(10) Patent No.: US 12,412,750 B2
(45) Date of Patent: Sep. 9, 2025

(54) PLASMA PROCESSING METHOD AND PLASMA PROCESSING APPARATUS

(71) Applicant: Tokyo Electron Limited, Tokyo (JP)

(72) Inventors: Shinya Ishikawa, Miyagi (JP); Kenta Ono, Miyagi (JP); Masanobu Honda, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 264 days.

(21) Appl. No.: 17/975,704

(22) Filed: Oct. 28, 2022

(65) Prior Publication Data

US 2023/0134436 A1     May 4, 2023

(30) Foreign Application Priority Data

Nov. 1, 2021  (JP) ................. 2021-178684

(51) Int. Cl.
   *H01L 21/308*       (2006.01)
   *H01L 21/033*       (2006.01)
   *H01L 21/311*       (2006.01)

(52) U.S. Cl.
CPC ...... *H01L 21/3086* (2013.01); *H01L 21/0332* (2013.01); *H01L 21/0334* (2013.01); *H01L 21/0337* (2013.01); *H01L 21/3081* (2013.01); *H01L 21/31116* (2013.01); *H01L 21/31138* (2013.01); *H01L 21/31144* (2013.01)

(58) Field of Classification Search
CPC ............ H01L 21/3086; H01L 21/0332; H01L 21/0334; H01L 21/0337; H01L 21/3081; H01L 21/31116; H01L 21/31138; H01L 21/31144

See application file for complete search history.

(56) References Cited

U.S. PATENT DOCUMENTS

2016/0379824 A1    12/2016   Wise et al.
2021/0217625 A1*   7/2021   Chung ................ H10B 12/482

\* cited by examiner

*Primary Examiner* — Anita K Alanko
(74) *Attorney, Agent, or Firm* — XSENSUS LLP

(57) ABSTRACT

A technique can control the dimensions of an opening. A plasma processing method includes (a) providing a substrate including an etching target layer, and a mask layer located on an upper surface of the etching target layer and having a side surface defining at least one opening on the upper surface of the etching target layer and an extension from the side surface to at least a portion of the upper surface of the etching target layer, (b) forming a deposition layer on at least the side surface of the mask layer, and (c) at least partially etching the deposition layer using plasma generated from a first process gas to reduce a thickness of the deposition layer. The first process gas contains a gas for etching the etching target layer, and (c) is performed until the etching target layer is partially etched in a depth direction to remove the extension.

17 Claims, 9 Drawing Sheets

PLASMA PROCESSING METHOD AND PLASMA PROCESSING APPARATUS

CROSS-REFERENCE TO RELATED APPLICATIONS

This application claims priority to Japanese Patent Application No. 2021-178684 filed on Nov. 1, 2021, the entire disclosure of which is incorporated herein by reference.

BACKGROUND

Technical Field

Exemplary embodiments of the present disclosure relate to a plasma processing method and a plasma processing apparatus.

Description of the Background

A technique for improving the opening features of a mask pattern is described in Patent Literature 1.

CITATION LIST

Patent Literature

Patent Literature 1: U.S. Patent Application Publication No. 2016/0379824

SUMMARY

One or more aspects of the present disclosure are directed to a technique for controlling the dimensions of an opening.

A plasma processing method according to an exemplary embodiment of the present disclosure includes (a) providing a substrate including an etching target layer, and a mask layer located on an upper surface of the etching target layer and having a side surface defining at least one opening on the upper surface of the etching target layer and an extension extending from the side surface to at least a portion of the upper surface of the etching target layer, (b) forming a deposition layer on at least the side surface of the mask layer, and (c) at least partially etching the deposition layer using plasma generated from a first process gas to reduce a thickness of the deposition layer. The first process gas contains a gas for etching the etching target layer, and (c) is performed until the etching target layer is partially etched in a depth direction to remove the extension.

The technique according to one exemplary embodiment of the present disclosure can control the dimensions of the opening.

DETAILED DESCRIPTION

Figure 1:
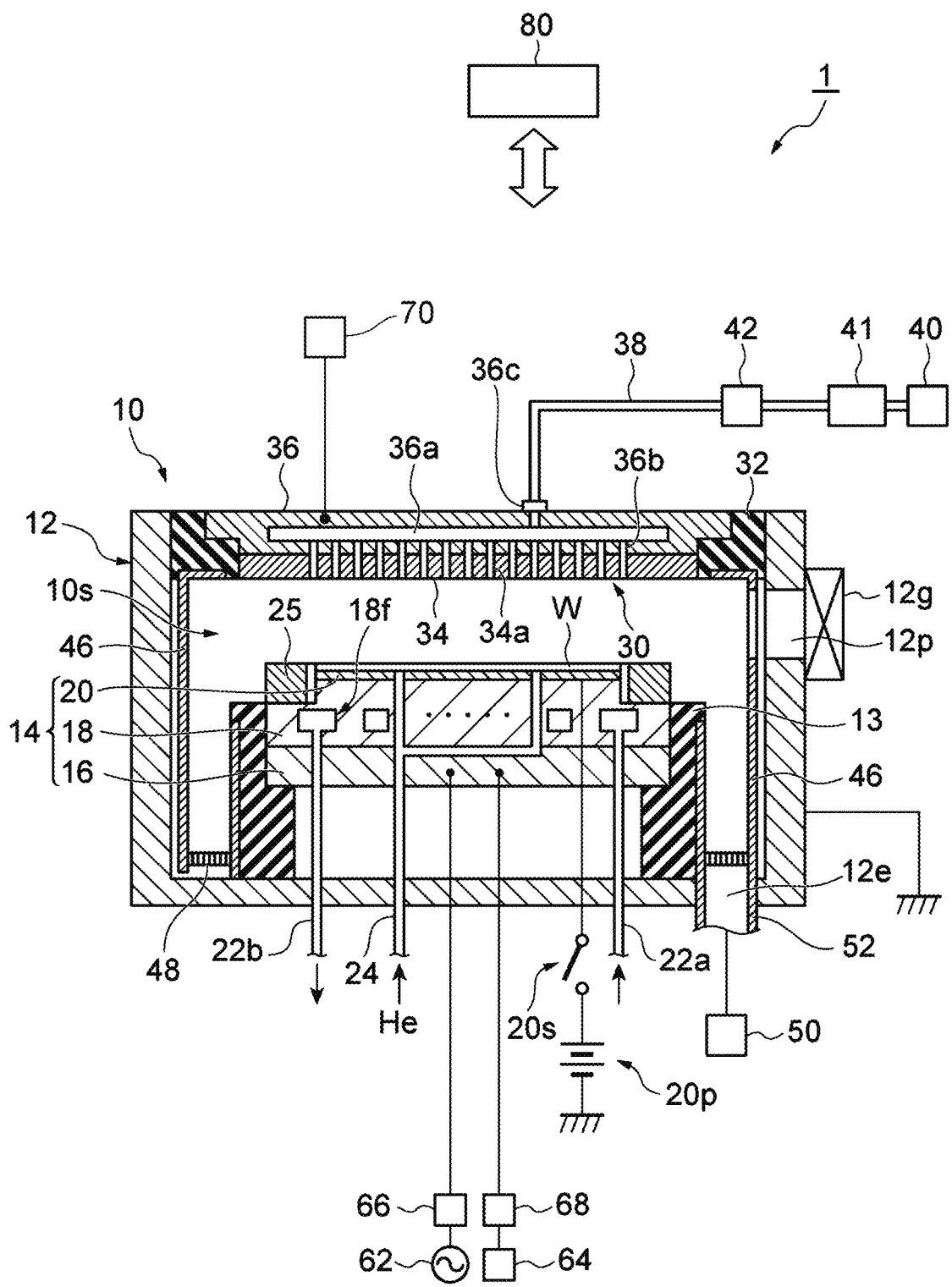
FIG. 1 is a schematic diagram of a plasma processing apparatus 1.

One or more embodiments of the present disclosure will be described below.

A plasma processing method according to an exemplary embodiment includes (a) providing a substrate including an etching target layer, and a mask layer located on an upper surface of the etching target layer and having a side surface defining at least one opening on the upper surface of the etching target layer and an extension extending from the side surface to at least a portion of the upper surface of the etching target layer, (b) forming a deposition layer on at least the side surface of the mask layer, and (c) at least partially etching the deposition layer using plasma generated from a first process gas to reduce a thickness of the deposition layer. The first process gas contains a gas for etching the etching target layer, and (c) is performed until the etching target layer is partially etched in a depth direction to remove the extension.

In one exemplary embodiment, the etching target layer includes a silicon-containing layer, the deposition layer includes an organic layer, and the first process gas contains a halogen-containing gas and a gas containing at least one element selected from the group consisting of oxygen, hydrogen, and nitrogen.

In one exemplary embodiment, the etching target layer includes an organic layer, the deposition layer includes a silicon-containing layer, and the first process gas contains a halogen-containing gas and a gas containing at least one element selected from the group consisting of oxygen, hydrogen, and nitrogen.

In one exemplary embodiment, the etching target layer includes a silicon-containing layer, the deposition layer includes a silicon-containing layer, and the first process gas contains a halogen-containing gas.

In one exemplary embodiment, the etching target layer includes an organic layer, the deposition layer includes an organic layer, and the first process gas contains a gas containing at least one element selected from the group consisting of oxygen, hydrogen, and nitrogen.

In one exemplary embodiment, the halogen-containing gas includes a fluorine-containing gas.

In one exemplary embodiment, the fluorine-containing gas includes at least one selected from the group consisting of an $NF_3$ gas, an $SF_6$ gas, an HF gas, and a $C_tH_uF_v$ gas, where t and v are positive integers, and u is an integer greater than or equal to 0.

In one exemplary embodiment, the gas containing at least one element selected from the group consisting of oxygen, hydrogen, and nitrogen includes at least one selected from the group consisting of an $O_2$ gas, an $O_3$ gas), a CO gas, a $CO_2$ gas, an $H_2$ gas, an $H_2O$ gas, an $H_2O_2$ gas, an $NH_3$ gas, and an NO gas.

In one exemplary embodiment, the first process gas contains at least one selected from the group consisting of an HBr gas, an HCl gas, a $Br_2$ gas, a $Cl_2$ gas, and an HI gas.

In one exemplary embodiment, (b) and (c) are alternately repeated a plurality of times.

In one exemplary embodiment, the plasma processing method further includes (d) etching the etching target layer using plasma generated from a second process gas and using the mask layer and the deposition layer as masks.

In one exemplary embodiment, the first process gas and the second process gas contain a gas of a same type.

A plasma processing method according to an exemplary embodiment includes (a) providing a substrate including an etching target layer, and a mask layer located on an upper surface of the etching target layer on a substrate support and having a side surface defining at least one opening on the upper surface of the etching target layer, (b) forming a deposition layer including a first portion on the side surface of the mask layer and a second portion on an upper surface of the mask layer, (c) applying an electrical bias to the substrate support and at least partially etching the deposition layer in an anisotropic manner using plasma generated from a first process gas to reduce a thickness of the deposition layer, and (d) etching the etching target layer using plasma generated from a second process gas and using the mask layer and the deposition layer as masks. In (c), the first portion is etched less than the second portion. The first process gas contains a gas for etching the etching target layer, and (c) is performed until the etching target layer is partially etched in a depth direction.

A plasma processing apparatus according to an exemplary embodiment includes a plasma processing chamber, a controllable gas supply that supplies a process gas to the plasma processing chamber, a power supply that provides electric power to generate plasma in the plasma processing chamber, and a controller that causes operations including (a) providing a substrate including an etching target layer, and a mask layer located on an upper surface of the etching target layer and having a side surface defining at least one opening on the upper surface of the etching target layer and an extension extending from the side surface to at least a portion of the upper surface of the etching target layer, (b) forming a deposition layer on at least the side surface of the mask layer, and (c) at least partially etching the deposition layer using plasma generated from a first process gas to reduce a thickness of the deposition layer. In (c), the first process gas contains a gas for etching the etching target layer, and (c) is performed until the etching target layer is partially etched in a depth direction to remove the extension.

One or more embodiments of the present disclosure will now be described with reference to the drawings. In the figures, the same or similar components are given the same reference numerals, and may not be described repeatedly. Unless otherwise specified, the positional relationships shown in the drawings are used to describe the vertical, lateral, and other positions. The drawings are not drawn to scale relative to the actual ratio of each component, and the actual ratio is not limited to the ratio in the drawings.

Structure of Plasma Processing Apparatus 1

FIG. 1 is a schematic diagram of a plasma processing apparatus 1 according to one exemplary embodiment. A substrate processing method according to one exemplary embodiment (hereinafter referred to as the processing method) may be used by the plasma processing apparatus 1.

The plasma processing apparatus 1 shown in FIG. 1 includes a chamber 10. The chamber 10 has an internal space 10s. The chamber 10 includes a chamber body 12 that is substantially cylindrical. The chamber body 12 is formed from, for example, aluminum. The chamber body 12 has an inner wall coated with an anticorrosive layer. The anticorrosive layer may be a layer of ceramic such as aluminum oxide or yttrium oxide.

The chamber body 12 has a side wall having a port 12p. A substrate W is transferred between the internal space 10s and the outside of the chamber 10 through the port 12p. The port 12p is open and closed by a gate valve 12g. The gate valve 12g is on the side wall of the chamber body 12.

A support 13 is located on the bottom of the chamber body 12. The support 13 is formed from an insulating material. The support 13 is substantially cylindrical. The support 13 extends upward from the bottom of the chamber body 12 into the internal space 10s. The support 13 supports a substrate support 14. The substrate support 14 supports the substrate W in the internal space 10s.

The substrate support 14 includes a lower electrode 18 and an electrostatic chuck (ESC) 20. The substrate support 14 may further include an electrode plate 16. The electrode plate 16 is substantially disk-shaped and is formed from a conductor such as aluminum. The lower electrode 18 is on the electrode plate 16. The lower electrode 18 is substantially disk-shaped and is formed from a conductor such as aluminum. The lower electrode 18 is electrically coupled to the electrode plate 16.

The ESC 20 is on the lower electrode 18. The substrate W is placed on the upper surface of the ESC 20. The ESC 20 includes a body and an electrode. The body of the ESC 20 is substantially disk-shaped and is formed from a dielectric. In the ESC 20, the electrode is a layer electrode located in the body. The electrode in the ESC 20 is coupled to a direct current (DC) power supply 20p through a switch 20s. A voltage is applied from the DC power supply 20p to the electrode in the ESC 20 to generate an electrostatic attraction between the ESC 20 and the substrate W. The substrate W is attracted to and held by the ESC 20 under the generated electrostatic attraction.

An edge ring 25 is placed on the substrate support 14. The edge ring 25 is annular and may be formed from silicon, silicon carbide, or quartz. The substrate W is placed in an area on the ESC 20 surrounded by the edge ring 25.

The lower electrode 18 has an internal channel 18f for carrying a heat-exchange medium (e.g., a refrigerant) being supplied through a pipe 22a from a chiller unit external to the chamber 10. The heat-exchange medium supplied to the channel 18f returns to the chiller unit through a pipe 22b. In the plasma processing apparatus 1, the temperature of the substrate W on the ESC 20 is adjusted through heat exchange between the heat-exchange medium and the lower electrode 18.

The plasma processing apparatus 1 includes a gas supply line 24. The gas supply line 24 supplies a heat-transfer gas (e.g., a He gas) from a heat-transfer gas supply assembly into a space between the upper surface of the ESC 20 and the back surface of the substrate W.

The plasma processing apparatus 1 further includes an upper electrode 30. The upper electrode 30 is located above the substrate support 14. The upper electrode 30 is supported in an upper portion of the chamber body 12 with a member 32. The member 32 is formed from an insulating material. The upper electrode 30 and the member 32 close a top opening of the chamber body 12.

The upper electrode 30 may include a ceiling plate 34 and a support member 36. The ceiling plate 34 has its lower surface exposed to and defining the internal space 10s. The ceiling plate 34 may be formed from a low resistance conductor or a semiconductor that generates less Joule heat. The ceiling plate 34 has multiple gas outlet holes 34a that are through-holes in the thickness direction.

The support member 36 supports the ceiling plate 34 in a detachable manner. The support member 36 is formed from a conductive material such as aluminum. The support member 36 has an internal gas-diffusion compartment 36a. The support member 36 has multiple gas holes 36b that extend downward from the gas-diffusion compartment 36a. The gas holes 36b communicate with the respective gas outlet holes 34a. The support member 36 has a gas inlet 36c. The gas inlet 36c is connected to the gas-diffusion compartment 36a. The gas inlet 36c is also connected to a gas supply pipe 38.

The gas supply pipe 38 is connected to a set of gas sources 40 through a set of flow controllers 41 and a set of valves 42. The flow controller set 41 and the valve set 42 are included in a controllable gas supply. The controllable gas supply may further include the gas source set 40. The gas source set 40 includes multiple gas sources. The gas sources include the sources of the process gas used with the processing method. The flow controller set 41 includes multiple flow controllers. The flow controllers in the flow controller set 41 are mass flow controllers or pressure-based flow controllers. The valve set 42 includes multiple open-close valves. The gas sources in the gas source set 40 are connected to the gas supply pipe 38 through the respective flow controllers in the flow controller set 41 and through the respective open-close valves in the valve set 42.

The plasma processing apparatus 1 includes a shield 46 along the inner wall of the chamber body 12 and along the periphery of the support 13 in a detachable manner. The shield 46 prevents a reaction product from accumulating on the chamber body 12. The shield 46 includes, for example, an aluminum base coated with an anticorrosive layer. The anticorrosive layer may be a layer of ceramic such as yttrium oxide.

A baffle plate 48 is located between the support 13 and the side wall of the chamber body 12. The baffle plate 48 includes, for example, an aluminum member coated with an anticorrosive layer (e.g., a yttrium oxide layer). The baffle plate 48 has multiple through-holes. The chamber body 12 has an outlet 12e in its bottom below the baffle plate 48. The outlet 12e is connected to an exhaust device 50 through an exhaust pipe 52. The exhaust device 50 includes a pressure control valve and a vacuum pump such as a turbomolecular pump.

The plasma processing apparatus 1 includes a radio frequency (RF) power supply 62 and a bias power supply 64. The RF power supply 62 generates RF power HF. The RF power HF has a first frequency suitable for generating plasma. The first frequency ranges from, for example, 27 to 100 MHz. The RF power supply 62 is coupled to the lower electrode 18 through an impedance matching circuit, or matcher 66, and through the electrode plate 16. The matcher 66 includes a circuit for matching the impedance of a load (the lower electrode 18) for the RF power supply 62 and the output impedance of the RF power supply 62. The RF power supply 62 may be coupled to the upper electrode 30 through the matcher 66. The RF power supply 62 serves as an exemplary plasma generator.

The bias power supply 64 generates an electrical bias. The bias power supply 64 is electrically coupled to the lower electrode 18. The electrical bias has a second frequency that is lower than the first frequency. The second frequency ranges from, for example, 400 kHz to 13.56 MHz. When used in addition to the RF power HF, the electrical bias is applied to the substrate support 14 to draw ions toward the substrate W. In one example, the electrical bias is applied to the lower electrode 18. The electrical bias applied to the lower electrode 18 changes the potential of the substrate W on the substrate support 14 to change in periods defined by the second frequency. The electrical bias may be applied to a bias electrode located in the ESC 20.

In one embodiment, the electrical bias may be RF power LF with the second frequency. When used in addition to the RF power HF, the RF power LF serves as RF bias power for drawing ions toward the substrate W. The bias power supply 64 that generates RF power LF is coupled to the lower electrode 18 through an impedance matching circuit, or matcher 68, and through the electrode plate 16. The matcher 68 includes a circuit for matching the impedance of a load (the lower electrode 18) for the bias power supply 64 and the output impedance of the bias power supply 64.

The RF power LF alone may be used to generate plasma, without the RF power HF being used. In other words, a single RF power may be used to generate plasma. In this case, the RF power LF may have a frequency higher than 13.56 MHz, or for example, 40 MHz. In this case, the plasma processing apparatus 1 may not include the RF power supply 62 and the matcher 66. The bias power supply 64 serves as an exemplary plasma generator.

In another embodiment, the electrical bias may be a pulsed voltage. In this case, the bias power supply may be a DC power supply. The bias power supply may apply a pulsed voltage or may include a device for pulsing the voltage downstream from the bias power supply. In one example, a pulsed voltage is applied to the lower electrode 18 to cause the substrate W to have a negative potential. The pulsed voltage may have a square wave pulse, a triangular wave pulse, an impulse, or any other waveforms.

The pulsed voltage occurs in periods defined by the second frequency. Each period of the pulsed voltage includes two periods. The pulsed voltage is negative in one of the two periods. The voltage has a higher level (a larger absolute value) in one period than in the other period. The voltage may be negative or positive in the other period. The negative voltage in the other period may have a level higher than zero or a level of zero. In this embodiment, the bias power supply 64 is coupled to the lower electrode 18 through a low-pass filter and through the electrode plate 16. The bias power supply 64 may be coupled to the bias electrode in the ESC 20, instead of to the lower electrode 18.

In one embodiment, the bias power supply 64 may apply a continuous-wave electrical bias to the lower electrode 18. In other words, the bias power supply 64 may continuously apply the electrical bias to the lower electrode 18.

In some embodiments, the bias power supply 64 may apply a pulsed electrical bias to the lower electrode 18. The pulsed electrical bias may be periodically applied to the lower electrode 18. The pulsed electrical bias occurs in periods defined by a third frequency. The third frequency is lower than the second frequency. The third frequency ranges from, for example, 1 Hz to 200 kHz inclusive. In some embodiments, the third frequency may range from 5 Hz to 100 kHz inclusive.

Each period of the pulsed electrical bias includes two periods, or specifically, a period H and a period L. The electrical bias has a higher level (or a higher level of the pulsed electrical bias) in the period H than in the period L. In other words, the level of the electrical bias may be changed to apply a pulsed electrical bias to the lower electrode 18. The electrical bias may have a level higher than zero in the period L. In some embodiments, the electrical bias may have a level of zero in the period L. In other words, the pulsed electrical bias may be applied to the lower electrode 18 by repeatedly turning on and off the electrical bias applied to the lower electrode 18. When the electrical bias is RF power LF, the power level of the electrical bias is the same level as the power level of the RF power LF. When the electrical bias is a pulsed negative DC voltage, the power level of the electrical bias is a level equivalent to the effective value of the absolute value of the negative DC voltage. The duty ratio of the pulsed electrical bias, or the ratio of the period H to the period of the pulsed electrical bias, ranges from, for example, 1 to 80% inclusive. In some embodiments, the duty ratio of the pulsed electrical bias may range from 5 to 50% inclusive or 50 to 99% inclusive. Of the periods during which the electrical bias is applied, the period L corresponds to a first period, and the period H corresponds to a second period. The level of the electrical bias in the period L corresponds to zero or a first level, and the level of the electrical bias in the period H corresponds to a second level.

In one embodiment, the RF power supply 62 may provide a continuous-wave RF power HF. In other words, the RF power supply 62 may continuously provide the RF power HF.

In some embodiments, the RF power supply 62 may provide pulsed-RF power HF.

The pulsed-RF power HF may be provided periodically. The pulsed-RF power HF occurs in periods defined by a fourth frequency. The fourth frequency is lower than the second frequency. In one embodiment, the fourth frequency is the same as the third frequency. Each period of the pulsed-RF power HF includes two periods, or specifically, a period H and a period L. The RF power HF has a higher power level in the period H than in the other period, or the period L. The RF power HF may have a power level higher than zero or a power level of zero in the period L. Of the periods during which the RF power HF is supplied, the period L corresponds to a third period, and the period H corresponds to a fourth period. The level of the RF power HF in the period L corresponds to zero or a third level, and the level of the electrical bias in the period H corresponds to a fourth level.

The periods of the pulsed-RF power HF may be synchronized with the periods of the pulsed electrical bias. The periods H of the pulsed-RF power HF may be synchronized with the periods H of the pulsed electrical bias. In some embodiments, the periods H of the pulsed-RF power HF may not be synchronized with the periods H of the pulsed electrical bias. The periods H of the pulsed-RF power HF may have the same durations as or may have durations different from the periods H of the pulsed electrical bias. The periods H of the pulsed-RF power HF may partially or entirely overlap the periods H of the pulsed electrical bias.

Figure 2:
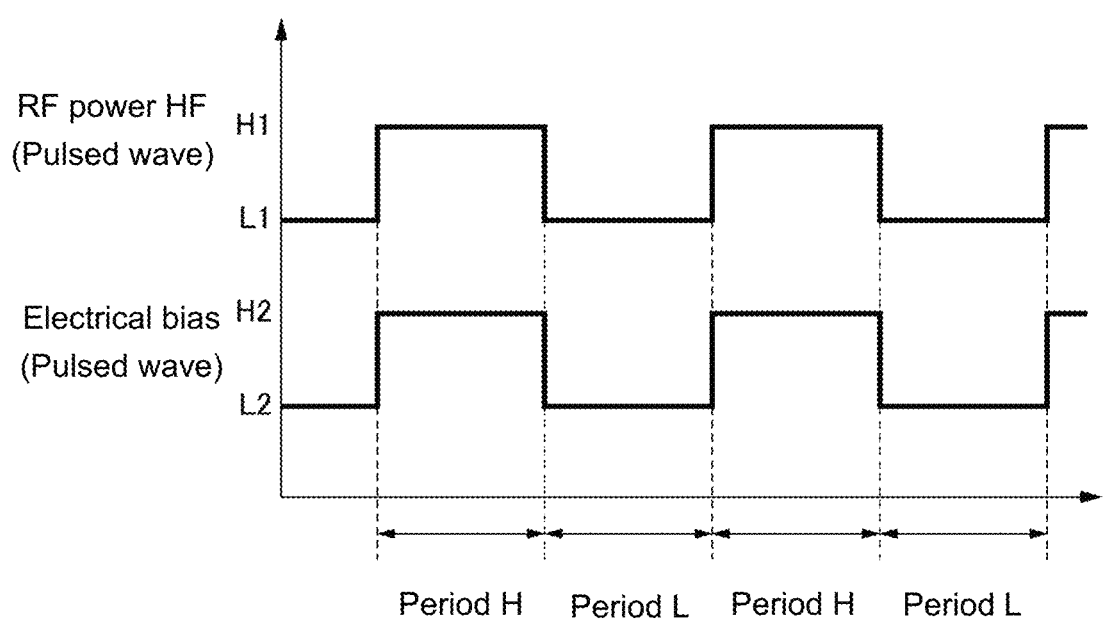
FIG. 2 is a timing chart showing example radio frequency (RF) power HF and an example electrical bias.

FIG. 2 is a timing chart showing example RF power HF and an example electrical bias. In FIG. 2, the RF power HF and the electrical bias are both provided in pulses. In FIG. 2, the horizontal axis indicates time, and the vertical axis indicates the power level of the RF power HF and the power level of the electrical bias. The RF power HF at L1 indicates the RF power HF not being provided or being provided at a power level lower than at H1. The electrical bias at L2 indicates the electrical bias not being applied or being applied at a power level lower than at H2. When the electrical bias is a pulsed negative DC voltage, the power level of the electrical bias is a level equivalent to the effective value of the absolute value of the negative DC voltage. The power level of the RF power HF and the power level of the electrical bias shown in FIG. 2 do not represent the relative relationship between them, but may be set as appropriate. In the example in FIG. 2, the periods of the pulsed-RF power HF are synchronized with the periods of the pulsed electrical bias. The periods H of the pulsed-RF power HF have the same duration as the periods H of the pulsed electrical bias, and the periods L of the pulsed-RF power HF have the same duration as the periods L of the pulsed electrical bias.

Referring back to FIG. 1, the plasma processing apparatus 1 further includes a power supply 70. The power supply 70 is coupled to the upper electrode 30. In one embodiment, the power supply 70 may provide a DC voltage or low-frequency power to the upper electrode 30 during the plasma processing. For example, the power supply 70 may provide a negative DC voltage or periodically provide low-frequency power to the upper electrode 30. The DC voltage or the low-frequency power may be provided in pulses or continuously. In this embodiment, positive ions in the internal space 10s for plasma processing are attracted to and collide with the upper electrode 30. This causes secondary electrons to be emitted from the upper electrode 30. The emitted secondary electrons modify a mask layer MF and improve the etching resistance of the mask layer MF. Secondary electrons also increase the plasma density. The emitted secondary electrons neutralize the charged substrate W, thus allowing more ions to be directed straight into the etched structure (the etched feature). For the upper electrode 30 formed from a silicon-containing material, silicon is emitted together with secondary electrons upon collision of the positive ions. The emitted silicon combines with oxygen in the plasma and is deposited on the mask as a silicon oxide compound, serving as a protective layer. The DC voltage or the low-frequency power provided to the upper electrode 30 improves the etching rate and reduces feature failures in the etched structure, in addition to improving the selectivity.

The controllable gas supply supplies a gas into the internal space 10s for plasma processing in the plasma processing apparatus 1. The RF power HF or the electrical bias or both are provided to form an RF electric field between the upper electrode 30 and the lower electrode 18. The resultant RF electric field generates plasma from the gas in the internal space 10s.

The plasma processing apparatus 1 may further include a controller 80, which may be implemented as the processing circuitry 805, discussed later in reference to FIG. 9. The controller 80 may be a computer including a processor, a storage such as a memory, an input device, a display, and an input-output interface for signals. The controller 80 controls the components of the plasma processing apparatus 1. An operator can use the input device in the controller 80 to input a command or perform other operations for managing the plasma processing apparatus 1. The display in the controller 80 can display and visualize the operating state of the plasma processing apparatus 1. The storage stores control programs and recipe data. The control program is executed by the processor to perform the processing in the plasma processing apparatus 1. The processor executes the control program to control the components of the plasma processing apparatus 1 in accordance with the recipe data. In one exemplary embodiment, the controller 80 may be partially or entirely included in a device external to the plasma processing apparatus 1.

Structure of Substrate Processing System PS

Figure 3:
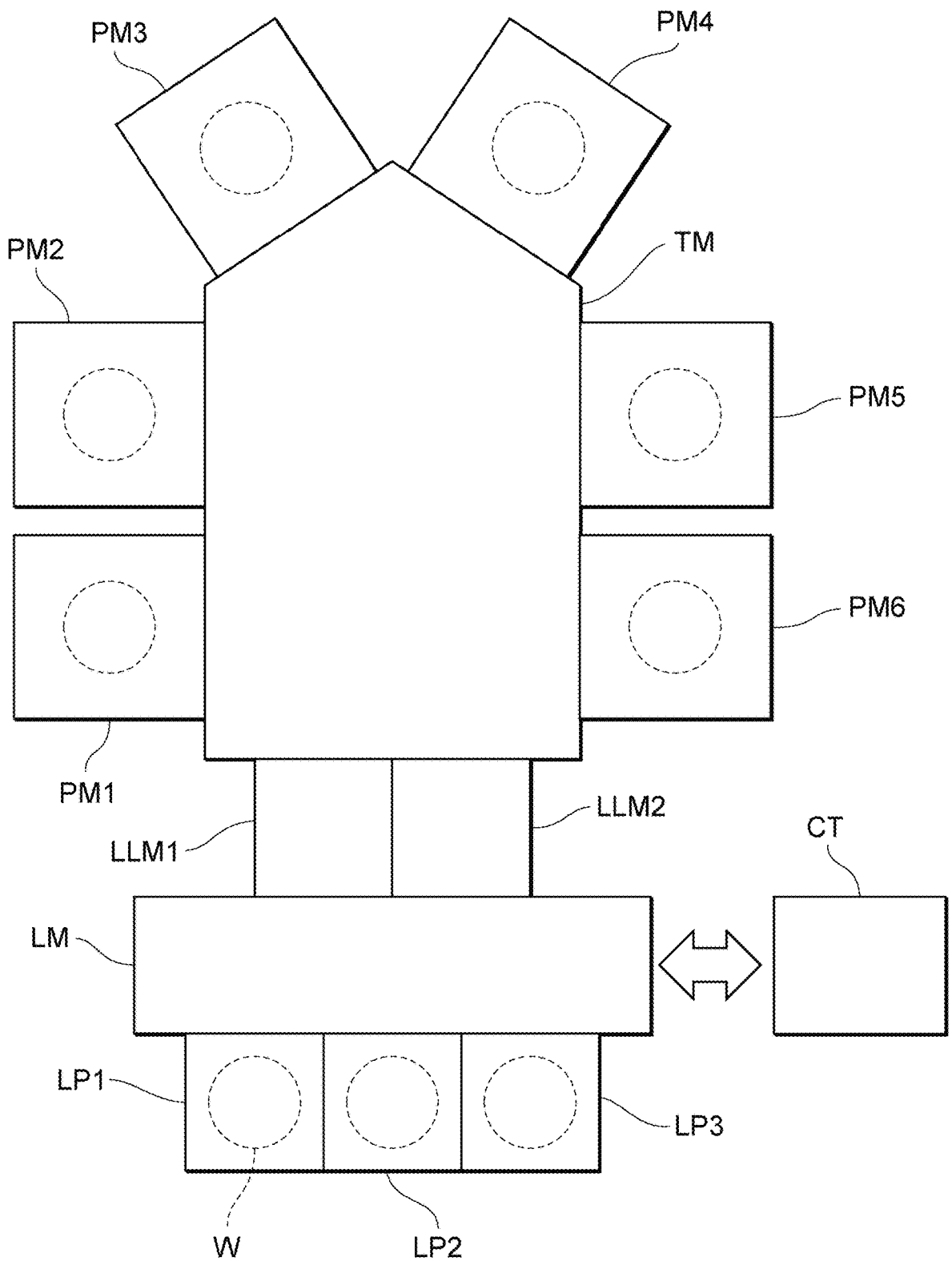
FIG. 3 is a schematic diagram of a substrate processing system PS.

FIG. 3 is a schematic diagram of a substrate processing system PS according to an exemplary embodiment. The processing method may be used by the substrate processing system PS.

The substrate processing system PS includes substrate processing chambers PM1 to PM6 (hereinafter also collectively referred to as the substrate processing modules PM), a transfer module TM, loadlock modules LLM1 and LLM2 (hereinafter also collectively referred to as the loadlock modules LLM), a loader module LM, and load ports LP1 to LP3 (hereinafter also collectively referred to as the load ports LP). A controller CT controls the components of the substrate processing system PS to perform intended processing on a substrate W.

Each substrate processing module PM performs etching, trimming, layer deposition, annealing, doping, lithography, cleaning, ashing, and other processing on the substrate W inside the substrate processing module PM. The substrate processing modules PM may include a measurement module, which may measure the thickness of a layer formed on the substrate W and the dimensions of a pattern formed on the substrate W using, for example, an optical method. The plasma processing apparatus 1 shown in FIG. 1 is an example of the substrate processing module PM.

The transfer module TM includes a transfer device that transfers the substrate W between the substrate processing modules PM or between a substrate processing module PM and a loadlock module LLM. The substrate processing modules PM and the loadlock modules LLM are located adjacent to the transfer module TM. The transfer module TM, the substrate processing modules PM, and the loadlock modules LLM are spatially isolated or connected through gate valves that can be open and closed.

The loadlock modules LLM1 and LLM2 are located between the transfer module TM and the loader module LM. Each loadlock module LLM can switch its internal pressure between an ambient atmosphere and a vacuum atmosphere. The loadlock module LLM transfers the substrate W from the loader module LM, which is in the ambient atmosphere, to the transfer module TM, which is in the vacuum atmosphere, or from the transfer module TM, which is in the vacuum atmosphere, to the loader module LM, which is in the ambient atmosphere.

The loader module LM includes a transfer device that transfers the substrate W between the loadlock module LLM and a load port LP. The load port LP can receive, for example, a front-opening unified pod (FOUP) that can store 25 substrates W or an empty FOUP. The loader module LM unloads a substrate W from the FOUP in the load port LP and transfers the substrate W to the loadlock module LLM. The loader module LM unloads a substrate W from the loadlock module LLM and transfers the substrate W to the FOUP in the load port LP.

The controller CT controls the components of the substrate processing system PS to perform intended processing on a substrate W. The controller CT stores recipes containing process procedures, process conditions, transfer conditions, or other sets of data. The controller CT controls the components of the substrate processing system PS to perform intended processing on a substrate W in accordance with the recipes. The controller CT may implement a part or all of the functions of the controller 80 in the plasma processing apparatus 1 shown in FIG. 1.

Exemplary Substrate W

Figure 4A:
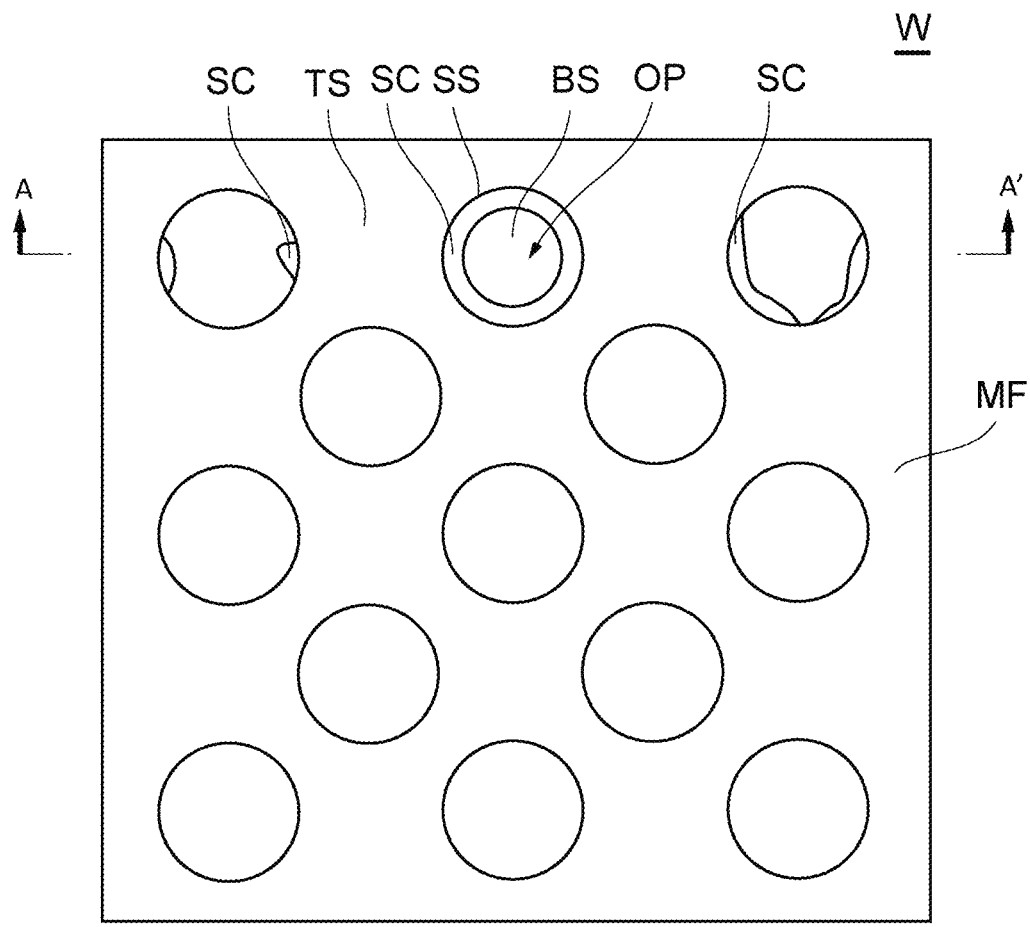
FIG. 4A is a schematic diagram of an exemplary substrate W.
Figure 4B:
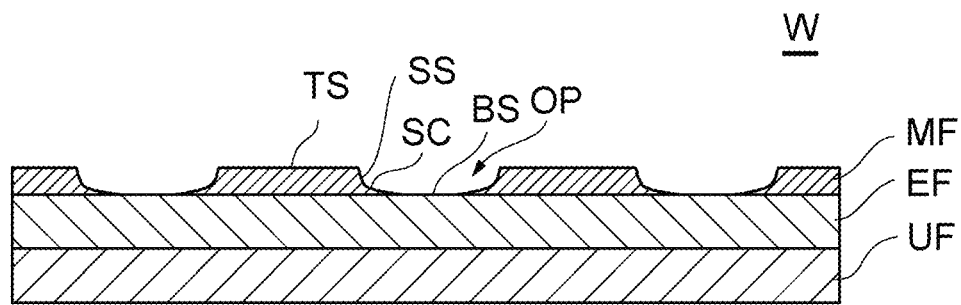
FIG. 4B is a schematic diagram of the exemplary substrate W.

FIGS. 4A and 4B are schematic diagrams of an exemplary substrate W. FIG. 4A is a plan view of the substrate W. FIG. 4B is a cross-sectional view of the substrate W taken along line A-A'. The substrate W includes an underlying layer UF, an etching target layer EF, and a mask layer MF stacked in this order. The substrate W is an example of a substrate on which the processing method may be performed.

The underlying layer UF may be, for example, a silicon wafer or an organic layer, a dielectric layer, a metal layer, or a semiconductor layer formed on the silicon wafer. The underlying layer UF may include multiple layers stacked on one another. For example, the underlying layer UF may include silicon oxide layers and polycrystalline silicon layers alternately stacked on each other or silicon oxide layers and silicon nitride layers alternately stacked on each other.

The etching target layer EF is different from the underlying layer UF. The etching target layer EF may be, for example, a silicon-containing layer or an organic layer. Examples of the silicon-containing layer include a silicon oxide layer, a silicon nitride layer, a silicon oxynitride layer (SiON layer), and a silicon-containing antireflective coating (SiARC) layer. Examples of the organic layer include a spin-on carbon (SOC) layer, an amorphous carbon layer, and an organic bottom antireflective coating (BARC) layer.

The mask layer MF is located on the etching target layer EF. The mask layer MF has an upper surface TS, a side surface SS continuous with the upper surface TS, and a lower surface in contact with the etching target layer EF. The mask layer MF has at least one opening OP. The opening OP is defined by the side surface SS of the mask layer MF. The opening OP is a space defined on the etching target layer EF surrounded by the side surface SS. In other words, in FIG. 4B, the upper surface of the etching target layer EF includes a portion covered with the mask layer MF and a portion exposed at a bottom surface BS of the opening OP.

The opening OP may have any feature in a plan view of the substrate W (when the substrate W is viewed from the top toward the bottom in FIG. 4B). The opening feature may be, for example, a circle, an oval, a rectangle, a line, or a combination of one or more of these features. The mask layer MF may have multiple openings OP. The multiple openings OP may be holes at regular intervals in a patterned array, as shown in FIG. 4A. The multiple openings OP may be slits arranged in a pattern of lines and spaces at regular intervals.

The side surface SS of the mask layer MF may have an extension SC extending from the side surface SS toward the opening OP. The extension SC is, for example, a portion extending from the side surface SS of the mask layer MF to at least a portion of the upper surface of the etching target layer EF. The extension SC may be, for example, a residual (a scum) of the mask layer MF on the outer edge of the bottom surface BS of the opening OP. The residual may be, for example, a remaining portion of a resist that has not been fully removed in the process of forming the opening OP in the mask layer MF (e.g., a developing process). The extension SC may be a protrusion protruding from the side surface SS toward the opening OP in an area above the bottom surface BS. The protrusion is a portion of the side surface SS that overhangs into the opening OP from the surrounding or adjacent portions of the side surface SS. The protrusion may be a residual of the mask layer MF. The side surface SS may have recesses such as dents or cracks (including breaks in a pattern such as a line pattern). The residual of the mask layer MF includes, in addition to the residual forming the extension SC described above, an isolated residual at the bottom BS of the opening OP without being connected with the side surface SS, and a residual that extends across the opening OP or bridges parts of the side surface SS. The residual may be, for example, a remaining portion of a resist that has not been fully removed in the process of forming the opening OP in the mask layer MF (e.g., a developing process).

The mask layer MF is different from the etching target layer EF. The mask layer MF may be, for example, a silicon-containing layer or an organic layer. Examples of the silicon-containing layer include a silicon oxide layer, a silicon nitride layer, an SiON layer, and an SiARC layer. Examples of the organic layer include an SOC layer, an amorphous carbon layer, and a photoresist layer.

The layers (the underlying layer UF, the etching target layer EF, and the mask layer MF) included in the substrate W may each be formed by chemical vapor deposition (CVD), atomic layer deposition (ALD), spin coating, or other methods. The layers may each be a flat layer or an uneven layer. The opening OP may be formed by etching the mask layer MF or by lithography. Two or more of the stacked layers of the mask layer MF, the etching target layer EF, and the underlying layer UF may function as a multilayer mask. For example, the substrate W may further include another layer under the underlying layer UF. The stacked layers of the mask layer MF, the etching target layer EF, and the underlying layer UF may be used as a multilayer mask to etch the other layer.

Exemplary Processing Method

Figure 5:
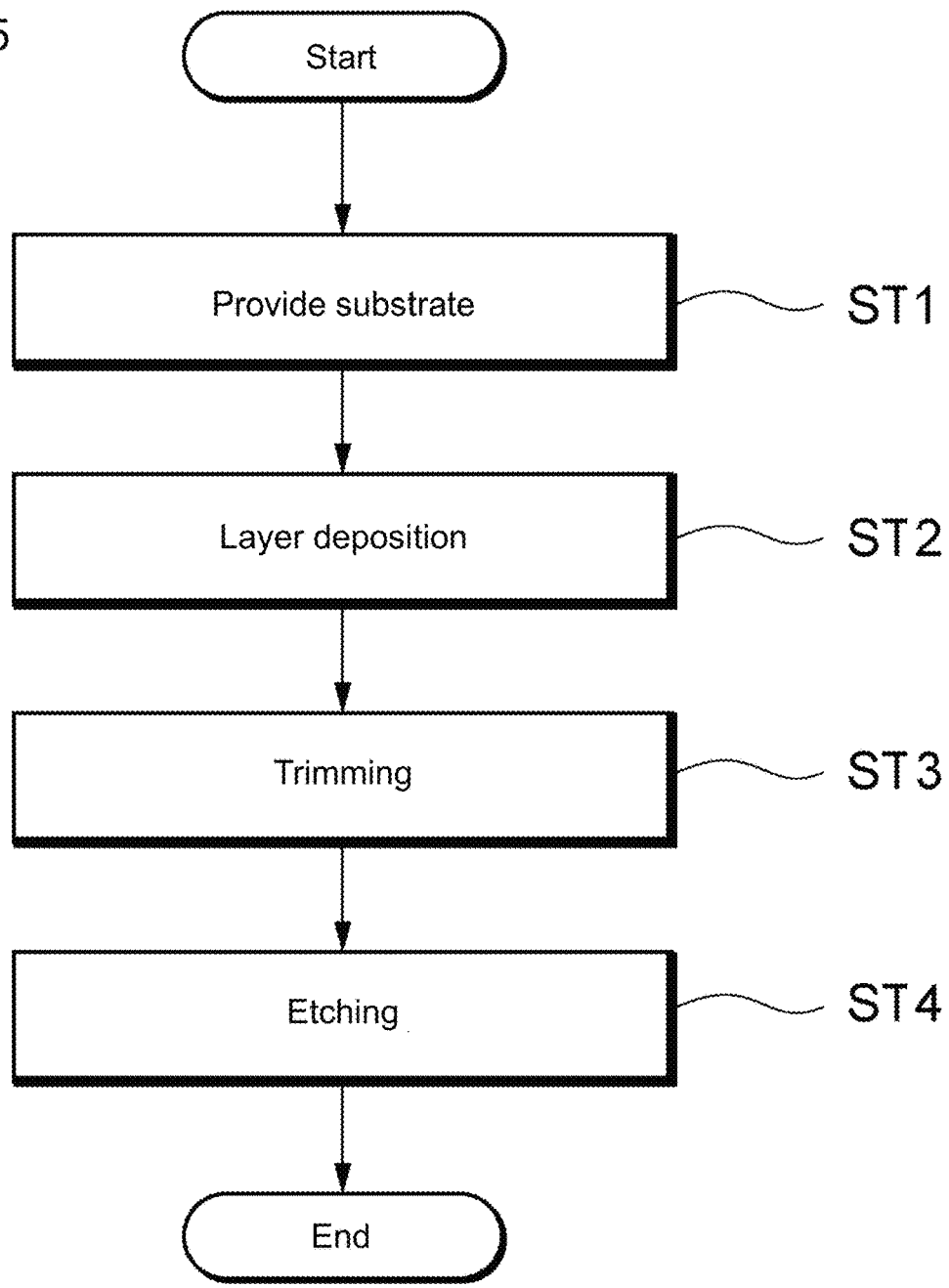
FIG. 5 is a flowchart of an exemplary processing method according to an embodiment.

FIG. 5 is a flowchart of an exemplary processing method according to an embodiment. As shown in FIG. 5, the processing method includes providing a substrate (step ST1), depositing a layer (step ST2), and trimming (step ST3). The processing method may further include etching (step ST4).

Figure 6A:
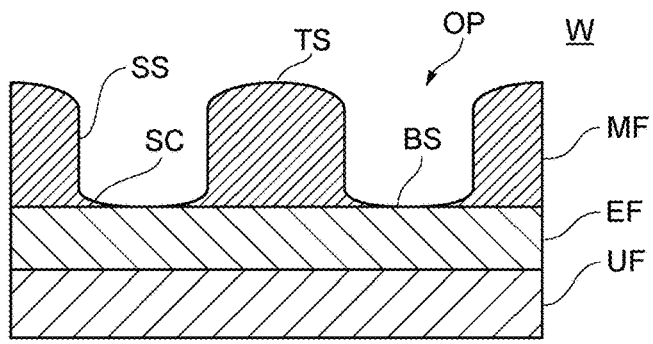
FIG. 6A is a schematic cross-sectional view of an exemplary substrate W processed in step ST1.
Figure 6B:
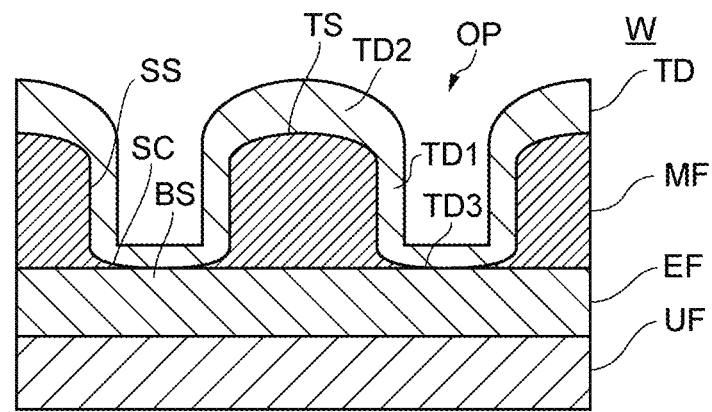
FIG. 6B is a schematic cross-sectional view of the exemplary substrate W processed in step ST2.
Figure 6C:
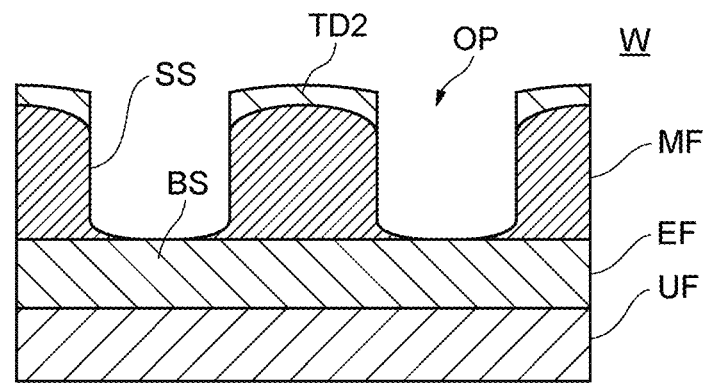
FIG. 6C is a schematic cross-sectional view of the exemplary substrate W processed in step ST3.
Figure 6D:
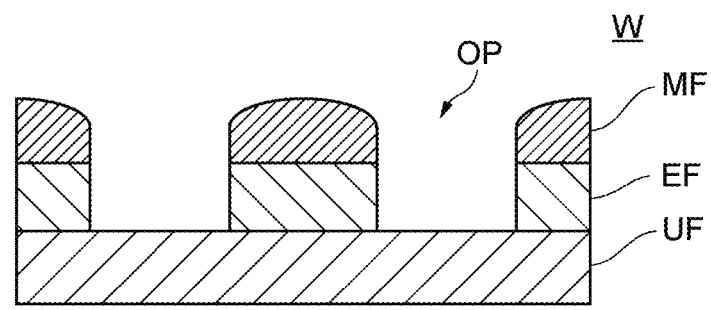
FIG. 6D is a schematic cross-sectional view of the exemplary substrate W processed in step ST4.
Figure 7:
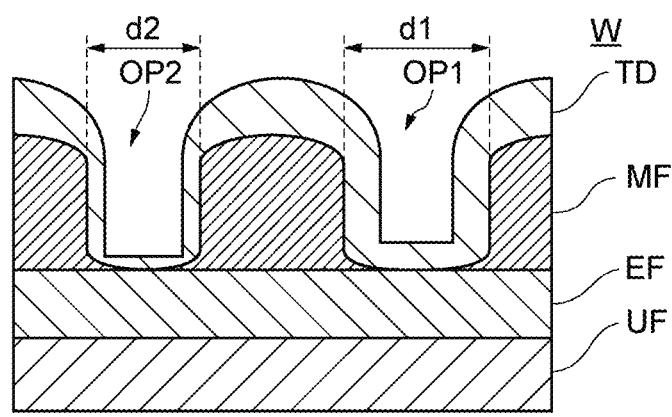
FIG. 7 is a schematic cross-sectional view of another exemplary substrate W processed in step ST2.

FIGS. 6A to 6D are schematic cross-sectional views of an exemplary substrate W processed in steps included in the processing method. FIG. 6A is a schematic cross-sectional view of the substrate W processed in step ST1. FIG. 6B is a schematic cross-sectional view of the substrate W processed in step ST2. FIG. 6C is a schematic cross-sectional view of the substrate W processed in step ST3. FIG. 6D is a schematic cross-sectional view of the substrate W processed in step ST4. FIG. 7 is a schematic cross-sectional view of another exemplary substrate W processed in step ST2.

Each step may be performed in the plasma processing apparatus 1 shown in FIG. 1. The controller 80 shown in FIG. 1 controls the components of the plasma processing apparatus 1 to perform the processing method on a substrate W. Each step may be performed in any substrate processing module PM in the substrate processing system PS shown in FIG. 3. For example, the layer deposition, the trimming, and the etching may be performed in different substrate processing modules PM, or may be performed continuously in one substrate processing module PM.

Step ST1: Providing Substrate

In step ST1, a substrate W is provided in the internal space 10s of the chamber 10. The substrate W is placed on the upper surface of the substrate support 14 and held by the ESC 20. The substrate W includes the underlying layer UF, the etching target layer EF, and the mask layer MF stacked in this order (Refer to FIG. 6A). The processing for forming each layer included in the substrate W may be at least partly performed in the internal space 10s. All or some of the layers included in the substrate W may be formed in a device or a chamber external to the plasma processing apparatus 1 (e.g., in the substrate processing module PM in the substrate processing system PS). The resultant substrate W may then be loaded into the internal space 10s and placed on the upper surface of the substrate support 14.

Step ST2: Layer Deposition

In step ST2, a deposition layer TD is formed (refer to FIG. 6B). The deposition layer TD includes a first portion TD1 at least on the side surface SS of the mask layer MF. The first portion TD1 may have a uniform thickness in the depth direction (from the top toward the bottom in FIG. 6B). The first portion TD1 may have a thickness increasing or decreasing in the depth direction. In an embodiment, the first portion TD1 may have a thickness decreasing in the depth direction. The first portion TD1 may have its surface with less surface roughness (including the number and sizes of irregular portions) than the side surface SS of the mask layer MF. For the mask layer MF having dents or cracks (including breaks in a pattern such as a line pattern) on the side surface SS, the first portion TD1 may be embedded in such dents or cracks. This can reduce the surface roughness of the side surface SS that defines the opening OP in the mask layer MF.

The deposition layer TD may include a second portion TD2 on the upper surface TS of the mask layer MF. The deposition layer TD may or may not include a third portion TD3 on the etching target layer EF exposed at the bottom surface BS of the opening OP. For the deposition layer TD with the third portion TD3, the first portion TD1 and the third portion TD3 may be curved or flat. The second portion TD2 may be thicker than the first portion TD1 and the third portion TD3. The second portion TD2 may include an extension (an overhang) from the upper surface TS toward the opening OP in a plan view of the substrate W. The overhang may, for example, partially or entirely overlap the extension SC in a plan view of the substrate W. The overhang may be curved or flat.

The deposition layer TD may be, for example, an organic layer. In this case, the deposition layer TD may be formed by, for example, plasma-enhanced chemical vapor deposition (PECVD) using plasma generated from a deposition gas containing a hydrocarbon ($C_xH_y$) gas (x and y are positive integers). The deposition gas may be a $C_tH_uF_v$ (t and v are positive integers, and u is an integer greater than or equal to 0) gas. Examples of the deposition gas include a $CH_4$ gas, a $C_2H_2$ gas, a $C_2H_4$ gas, a $C_3H_6$ gas, a $CH_3F$ gas, and a $C_4F_6$ gas. The process gas may further contain an inert gas such as Ar, He, or $N_2$, or an $H_2$ gas, or both. The mask layer MF including a silicon-containing layer may be etched with plasma generated from a deposition gas containing fluorine. Thus, for the mask layer MF including a silicon-containing layer, a condition may be selected to perform deposition with higher priority than etching, or the deposition gas may be selected from a hydrocarbon gas such as a $CH_4$ gas, a $C_2H_2$ gas, a $C_2H_4$ gas, or a $C_3H_6$ gas.

The deposition layer TD may be formed by thermal CVD, ALD, or sub-conformal ALD, in addition to PECVD. ALD includes the steps below. In a first step, a precursor gas is supplied to the substrate W, and the precursor gas is adsorbed onto the surface of the substrate W, or more specifically, onto the surface of the mask layer MF and the surface of the etching target layer EF exposed at the bottom surface BS of the opening OP. Plasma may be generated from the precursor gas. In a second step, a reaction gas is supplied to the substrate W. The reaction gas reacts with the precursor gas adsorbed on the surface of the substrate W. This causes the precursor gas to react with the reaction gas to form the deposition layer TD. Plasma may be generated from the reaction gas. After the first step and before the second step, or after the second step, or both, an inert gas may be supplied to the substrate W to purge an excess precursor gas or an excess reaction gas (purging). In ALD, a predetermined material is adsorbed on and reacts with a substance on the surface of the substrate W in a self-limiting manner, thus forming the deposition layer TD. Using a sufficient processing duration typically allows ALD to form the deposition layer TD that is conformal.

In contrast, sub-conformal ALD uses a processing condition under which a material is not completely adsorbed on or does not completely react on the surface of the substrate W in a self-limiting manner. Sub-conformal ALD includes at least two processing modes.
  (i) After the precursor gas is adsorbed on the entire surface of the substrate W, the reaction gas is supplied not to cover the entire surface of the substrate W on which the precursor gas is absorbed.
  (ii) After the precursor gas is adsorbed on a part of the surface of the substrate W, the reaction gas is supplied to react with the precursor adsorbed on the part of the surface of the substrate W alone.
  Such sub-conformal ALD allows formation of a layer with a thickness decreasing in the depth direction of the mask layer MF.

The deposition layer TD may be, for example, an Si-containing layer. In this case, the deposition layer TD may be formed by, for example, PECVD using plasma generated from a process gas containing, for example, an Si-containing gas. Examples of the process gas include an $SiCl_4$ gas, an $Si_2C_{16}$ gas, an $SiF_4$ gas, and an aminosilane-based gas. The process gas may further contain an inert gas such as Ar or He. The deposition layer TD may be formed by thermal CVD, ALD, or sub-conformal ALD.

The deposition conditions for the deposition layer TD may be adjusted to achieve a loading effect (in other words, the deposition layer TD has a thickness varying depending on the width of the opening OP). For example, as shown in FIG. 7, the deposition conditions may be adjusted to allow the deposition layer TD in an opening OP1 at a width d1 to be thicker than the deposition layer TD in an opening OP2 at a width d2 (d2<d1). This may offset the variation in the opening widths of the openings OP.

Step ST3: Trimming

In step ST3, the deposition layer TD is partially trimmed by plasma etching using a first process gas (refer to FIG. 6C). Trimming refers to a process of partially etching the deposition layer TD using plasma generated from the first process gas to reduce the thickness of the deposition layer TD. With this processing method, the first process gas contains one or more gases for etching the deposition layer TD and the etching target layer EF. In other words, plasma generated from the first process gas etches the etching target layer EF, in addition to the deposition layer TD. With this processing method, trimming is performed until the third portion TD3 of the deposition layer TD is removed and until the etching target layer EF (the portion located below the opening OP) is partially etched in the depth direction. The etching target layer EF exposed through the opening OP may be flat or curved after trimming. The curved surface may have, for example, a shape corresponding to the extension SC of the mask layer MF (a feature obtained by lowering the extension SC of the mask layer MF in the depth direction of the etching target layer EF), as shown in FIG. 6C.

Trimming may partially remove the mask layer MF, in addition to the deposition layer TD. For example, the extension SC extending from the side surface SS of the mask layer MF may be removed. The deposition layer TD (e.g., the first portion TD1 or TD2) may partially remain without being removed after trimming. The first portion TD1 of the deposition layer TD that remains without being removed may offset variations in the opening widths of the openings OP in the mask layer MF or improve the surface roughness (including the number and sizes of irregular portions) of the side surface SS of the mask layer MF. The second portion TD2 of the deposition layer TD that remains without being removed may also protect the mask layer MF in step ST4 (etching).

The first process gas may be selected in accordance with the materials contained in the deposition layer TD and the etching target layer EF. For example, for the etching target layer EF being a silicon-containing layer and the deposition layer TD being an organic layer, the first process gas may contain a halogen-containing gas and a gas containing at least one element selected from the group consisting of oxygen, hydrogen, and nitrogen. For the etching target layer EF being an organic layer and the deposition layer TD being a silicon-containing layer, the first process gas may contain a halogen-containing gas and a gas containing at least one element selected from the group consisting of oxygen, hydrogen, and nitrogen. For the etching target layer EF and the deposition layer TD being silicon-containing layers, the first process gas may contain a halogen-containing gas. For the etching target layer EF and the deposition layer TD being organic layers, the first process gas may contain a gas containing at least one element selected from the group consisting of oxygen, hydrogen, and nitrogen.

The halogen-containing gas in the first process gas may be used to adjust, in trimming, the shape of the deposition layer TD or the mask layer MF including a silicon-containing layer. For example, the halogen-containing gas may remove any overhang in the second portion TD2 or remove the third portion TD3 of the deposition layer TD including a silicon-containing layer. The halogen-containing gas may also remove the extension SC extending from the side surface SS of the mask layer MF including a silicon-containing layer and reduce the surface roughness of the side surface SS of the mask layer MF. The halogen-containing gas also facilitates etching of the etching target layer EF including a silicon-containing layer in the depth direction in trimming.

The halogen-containing gas may be a fluorine-containing gas. The fluorine-containing gas may be, for example, at least one selected from the group consisting of an $NF_3$ gas, an $SF_6$ gas, an HF gas, and a $C_tH_uF_v$ (t and v are positive integers, and u is an integer greater than or equal to 0) gas. In one example, the $C_tH_uF_v$ gas is a $CF_4$ gas or a $CHF_3$ gas, or both.

The gas containing at least one element selected from the group consisting of oxygen, hydrogen, and nitrogen in the first process gas is used to adjust, in trimming, the shape of the deposition layer TD or the mask layer MF including an organic layer. The gas may remove any overhang in the second portion TD2 or remove the third portion TD3 of the deposition layer TD including an organic layer. The gas may also remove the extension SC extending from the side surface SS of the mask layer MF including an organic layer and reduce the surface roughness of the side surface SS of the mask layer MF. The gas also facilitates etching of the etching target layer EF including an organic layer in the depth direction in trimming.

The gas containing at least one element selected from the group consisting of oxygen, hydrogen, and nitrogen may be at least one selected from the group consisting of an $O_2$ gas, an $O_3$ gas), a CO gas, a $CO_2$ gas, an NO gas, an $H_2O$ gas, an $H_2O_2$ gas, an $H_2$ gas, an $N_2$ gas, and an $NH_3$ gas.

The first process gas may further contain a halogen-containing gas other than fluorine. The halogen-containing gas other than fluorine may be at least one selected from the group consisting of an HBr gas, an HCl gas, a $Br_2$ gas, a $Cl_2$ gas, and an HI gas. The first process gas may further contain an inert gas such as Ar or He.

Trimming may be performed by anisotropic etching. In other words, the amount of etching (a decrease in the layer thickness) of the first portion TD1 of the deposition layer TD in trimming may be smaller than the amount of etching (a decrease in the layer thickness) of the second portion TD2 or the third portion TD3 of the deposition layer TD. Similarly, the amount of etching of the side surface SS of the mask layer MF may be smaller than the amount of etching of the upper surface TS of the mask layer MF. Anisotropic etching may be performed by applying an electrical bias to the substrate support 14 supporting the substrate W, or by selecting the first process gas. For trimming, for example, the deposition layer TD including an organic layer using the gas containing at least one element selected from the group consisting of oxygen, hydrogen, and nitrogen, anisotropic etching may be performed by applying an electrical bias to the substrate support 14. For trimming, for example, the deposition layer TD including a silicon-containing layer, anisotropic etching may be performed using a fluorine-containing gas such as an $NF_3$ gas as the first process gas.

Step ST4: Etching

In step ST4, plasma generated from a second process gas is used to etch the etching target layer EF (refer to FIG. 6D). The etching target layer EF is anisotropically etched using the mask layer MF and the deposition layer TD as masks. In other words, the etching target layer EF is anisotropically etched in the depth direction of the opening OP through the exposed portion at the bottom surface BS of the opening OP.

The second process gas may be selected to cause the etching target layer EF to be selectively etched with respect to the first portion TD1 and the mask layer MF. For the etching target layer EF including a silicon-containing layer, the second process gas may contain a halogen-containing gas. The halogen-containing gas may be a fluorine-containing gas. The fluorine-containing gas may be, for example, at least one selected from the group consisting of an $NF_3$ gas, an $SF_6$ gas, an HF gas, and a $C_tH_uF_v$ (t and v are positive integers, and u is an integer greater than or equal to 0) gas. In one example, the $C_tH_uF_v$ gas is a $CF_4$ gas or a $CHF_3$ gas, or both. The halogen-containing gas in the second process gas may be the same as or different from the halogen-containing gas in the first process gas. The second process gas may further contain an inert gas such as Ar, He, or $N_2$, or an $H_2$ gas, or both.

For the etching target layer EF including an organic layer, the second process gas may contain a gas containing at least one element selected from the group consisting of oxygen, hydrogen, and nitrogen. The gas may be at least one selected from the group consisting of an $O_2$ gas, an $O_3$ gas), a CO gas, a $CO_2$ gas, an NO gas, an $H_2O$ gas, an $H_2O_2$ gas, an $H_2$ gas, an $N_2$ gas, and an $NH_3$ gas. The gas containing at least one element selected from the group consisting of oxygen, hydrogen, and nitrogen in the second process gas may be the same as or different from the gas containing at least one element selected from the group consisting of oxygen, hydrogen, and nitrogen in the first process gas. The second process gas may further contain an inert gas such as Ar or He.

With this processing method, the trimming in step ST3 is performed until the etching target layer EF is partially removed. The etching target layer EF is partially removed to allow easy removal of the extension SC extending toward the opening OP in the mask layer MF. This allows appropriate control of the dimensions or the feature of the opening OP without alternately repeating the deposition and the trimming multiple times, or while controlling the count of such cycles (in other words, without increasing the throughput). With this processing method, the mask layer MF is used as a mask to etch the etching target layer EF. This allows appropriate control of the dimensions or the feature of the opening formed in the etching target layer EF.

EXAMPLES

An example and a reference example of the processing method will now be described. The present disclosure is not limited to the example described below.

The substrate W in the example has a stacked structure of a spin-on carbon layer (the underlying layer UF), an SiARC layer (the etching target layer EF), and a photoresist layer (the mask layer MF) (refer to FIG. 6A). The photoresist layer has, as its opening pattern, a hole pattern shown in FIG. 4A. In the example, an organic layer (the deposition layer TD) was deposited on the substrate W by PECVD using a mixture of a hydrocarbon gas and an inert gas (refer to FIG. 6B). The organic layer and the photoresist layer were then partially trimmed by plasma etching using a mixture of a halogen-containing gas, an oxygen-containing gas, and an inert gas (the first process gas). The SiARC layer was also partially trimmed in the depth direction until the extension SC extending from the side surface SS to a portion of the upper surface of the etching target layer EF was removed (refer to FIG. 6C).

In the reference example, a substrate W with the same structure and the same hole pattern as the substrate W in the example was used. In the reference example, an organic layer was deposited on the photoresist layer included in the substrate W by PECVD using a mixture of a hydrocarbon gas and an inert gas, and the organic layer and the photoresist layer were partially trimmed by plasma etching using a mixture of an oxygen-containing gas and an inert gas. The deposition and the trimming were alternately repeated multiple times. In the reference example, the SiARC layer remained substantially unetched in the depth direction.

Table 1 shows the measurement results of critical dimensions (CDs) of the openings OP in the photoresist layers included in the substrates W and their local critical dimension uniformity (LCDU), which is 36 of the CD, after the above processing in the example and in the reference example. In Table 1, the CD and the LCDU are values obtained by dividing the CD and LCDU measurements of the opening OP taken after the above processing by these measurements taken before the above processing. The CD measurements are averages. The throughput (T/P) is the time (in seconds) used for the above processing.

TABLE 1

|  | Example | Reference example |
|---|---|---|
| CD | 0.94 | 0.90 |
| LCDU | 0.58 | 0.75 |
| T/P | 42 | 750 |

As shown in Table 1, the measurement results in the example are improved over the measurement results in the reference example. First, the LCDU of the opening in the photoresist layer in the example is improved over the LCDU of the opening in the photoresist layer in the reference example. In the example, the above improvement is achieved with a single deposition process and a single trimming process. The throughput is improved greatly as compared with the reference example, in which the deposition and the trimming were alternately repeated multiple times. In other words, in the example, the CD uniformity of the openings in the photoresist layer is improved more in a shorter time than in the reference example.

Another Embodiment of Processing Method

Figure 8:
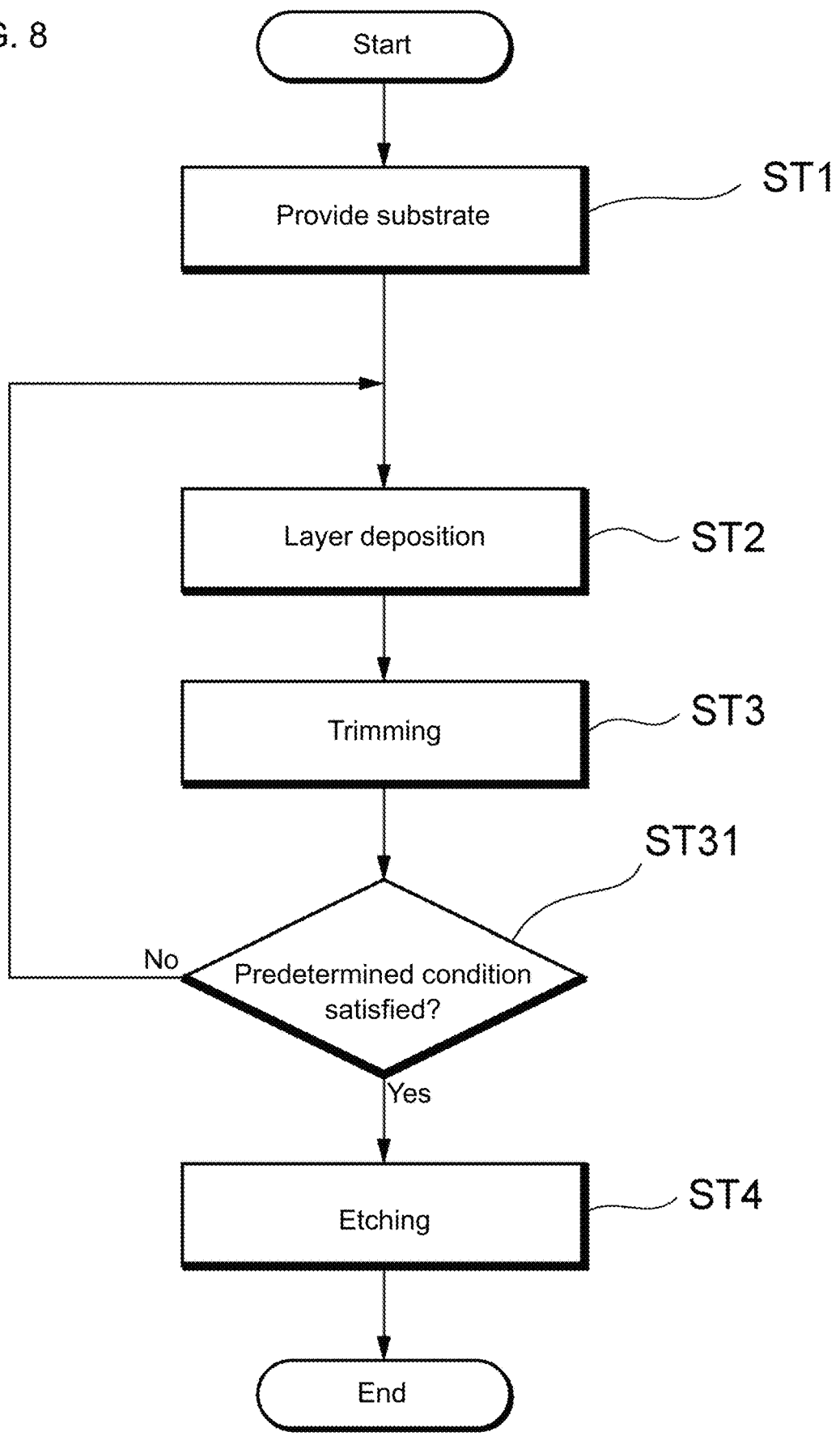
FIG. 8 is a flowchart of an exemplary processing method according to another embodiment.

FIG. 8 is a flowchart of the processing method according to another exemplary embodiment. In the present embodiment, the processing method further includes step ST31 to determine whether a predetermined condition is satisfied before the processing advances from step ST3 (trimming) to step ST4 (etching). Step ST2 (layer deposition) and step ST3 (trimming) are repeated until the predetermined condition is satisfied. This is the difference of the present embodiment from the example shown in FIG. 5.

The predetermined condition in step ST31 may be defined as appropriate. For example, the predetermined condition may be the count of cycles in which step ST2 (layer deposition) and step ST3 (trimming) are performed. In other words, the determination may be performed as to whether the count of cycles reaches the predefined number. Steps ST2 and ST3 may be repeated until the count of cycles reaches the predefined number. For example, the predetermined condition may be whether the dimensional data of the opening OP in the mask layer MF processed through step ST3 (trimming) falls within an intended range. More specifically, the CD and the LCDU of the opening OP in the mask layer MF may be measured after step ST3 (trimming). Steps ST2 and ST3 may be repeated until the measurements fall within the intended range.

The dimensions of the opening OP may be measured with an optical measurement device. The measurement device may be one of the substrate processing modules PM shown in FIG. 3. In one example, the processing method may be performed to process multiple substrates W (e.g., 25 pieces) in one unit (hereinafter also referred to as a lot). In this case, the dimensions of the opening OP may be measured for each substrate included in the lot. The dimensions of the opening OP may be measured for a particular substrate in one lot, and the measurements may be used as the dimensions of the opening in the particular substrate and as the dimensions of other substrates in the lot. Of the multiple substrates in one lot, the substrate to be measured may be (a) the first substrate processed with the processing method, (b) the last substrate processed with the processing method, or (c) a substrate processed with the processing method except the first or the last substrate in the lot.

In the present embodiment, the etching (step ST4) is not performed until the predetermined condition is satisfied. This allows appropriate control of the dimensions or the feature of the opening formed in the etching target layer EF.

The processing method may be modified in various ways without departing from the spirit and scope of the present disclosure. For example, the processing method may be performed with, in addition to the plasma processing apparatus 1 using capacitively coupled plasma, a substrate processing apparatus using any plasma source for, for example, inductively coupled plasma or microwave plasma. The deposition, the trimming, and the etching included in the processing method may be performed continuously in the same chamber or may be performed in different chambers.

Figure 9:
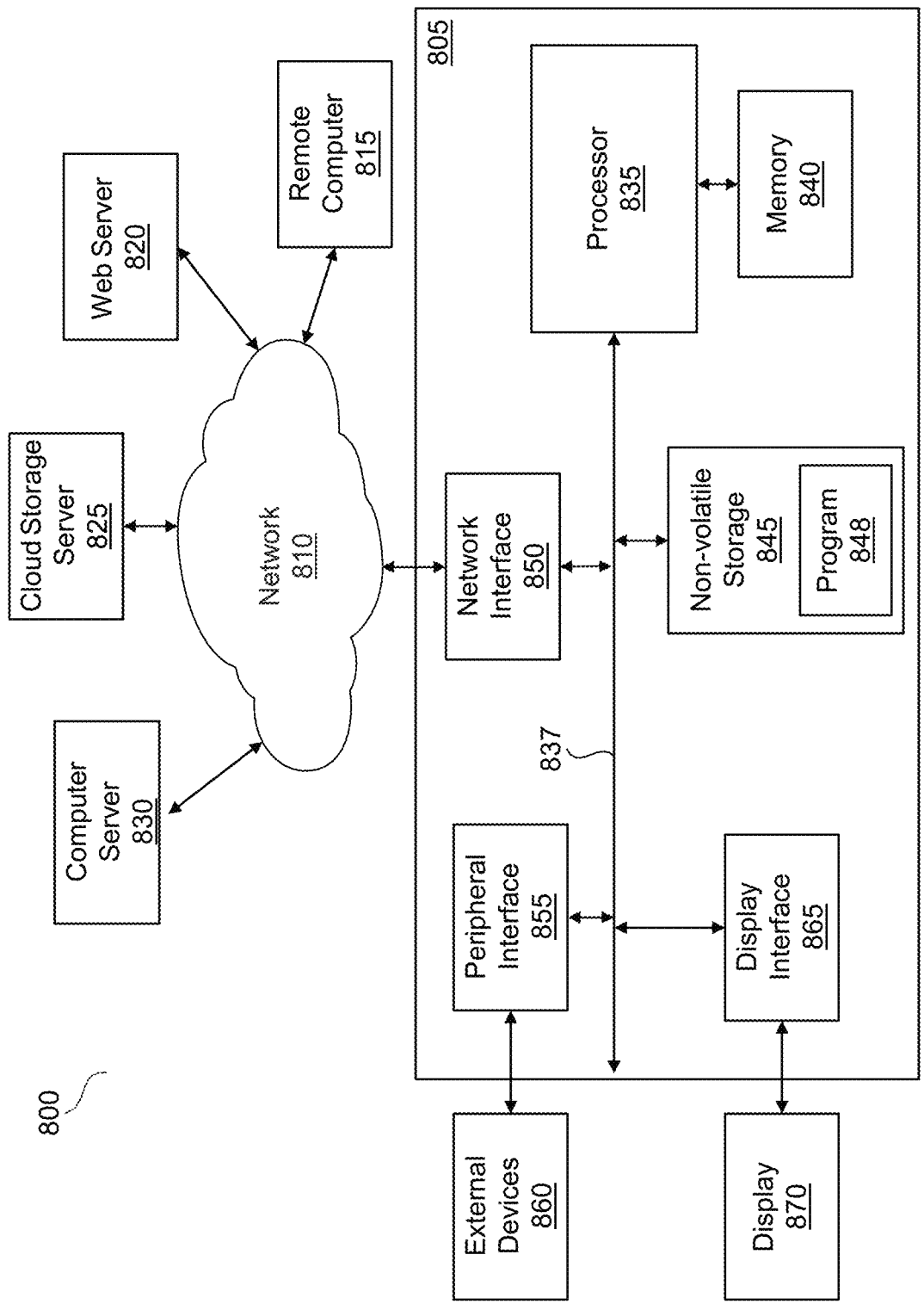
FIG. 9 is a block diagram of processing circuitry in accordance with an exemplary embodiment.

FIG. 9 is a block diagram of processing circuitry for performing computer-based operations described herein. FIG. 9 illustrates processing circuitry 805 that may be used to control any computer-based control processes, descriptions or blocks in flowcharts can be understood as representing modules, segments or portions of code which include one or more executable instructions for implementing specific logical functions or steps in the process, and alternate implementations are included within the scope of the exemplary embodiments of the present advancements in which functions can be executed out of order from that shown or discussed, including substantially concurrently or in reverse order, depending upon the functionality involved, as would be understood by those skilled in the art. The various elements, features, and processes described herein may be used independently of one another or may be combined in various ways. All possible combinations and sub-combinations are intended to fall within the scope of this disclosure.

In FIG. 9, the processing circuitry 805 includes a processor (CPU) 835 which performs one or more of the control processes described above/below. The process data and instructions may be stored in memory 840. These processes and instructions (e.g., program 848) may also be stored on a storage medium disk 845 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the processing circuitry 805 communicates, such as a server or computer.

Further, the claimed advancements may be provided as a utility application, background daemon, or component of an operating system, or combination thereof, executing in conjunction with CPU 835 and an operating system such as Microsoft Windows, UNIX, Solaris, LINUX, Apple MAC-OS and other systems known to those skilled in the art.

The hardware elements in order to achieve the processing circuitry 805 may be realized by various circuitry elements. Further, each of the functions of the above described embodiments may be implemented by circuitry, which includes one or more processing circuits. A processing circuit includes a particularly programmed processor, for example, processor (CPU) 835, as shown in FIG. 9. A processing circuit also includes devices such as an application specific integrated circuit (ASIC) and conventional circuit components arranged to perform the recited functions.

In FIG. 9, the processing circuitry 805 includes a CPU 835 which performs the processes described above. The processing circuitry 805 may be a general-purpose computer or a particular, special-purpose machine.

Alternatively, or additionally, the CPU 835 may be implemented on an FPGA, ASIC, PLD or using discrete logic circuits, as one of ordinary skill in the art would recognize. Further, CPU 835 may be implemented as multiple processors cooperatively working in parallel to perform the instructions of the inventive processes described above.

The processing circuitry 805 in FIG. 9 also includes a network controller such as an Intel Ethernet PRO network interface card from Intel Corporation of America, for interfacing with network 810 via the network interface 850. As can be appreciated, the network 810 can be a public network, such as the Internet, or a private network such as an LAN or WAN network, or any combination thereof and can also include PSTN or ISDN sub-networks. The network 810 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The processing circuitry 805 further includes a display controller/display interface 865, such as a graphics card or graphics adaptor for interfacing with display 870, such as a monitor. A peripheral interface 855 interfaces with external devices 860 such as a keyboard, mouse, touch screen panel, etc. Peripheral interface 855 also connects to a variety of peripherals including printers and scanners. A processing circuitry system 800 can include the processing circuitry 805, along with a computer server 830, a cloud storage server 825, a web server 820, and a remote computer 815 which are connected to the processing circuitry 805 via the network 810. A description of the general features and functionality of the display 870, keyboard and/or mouse, as well as the display interface 865, the peripheral interface 855, the network interface 850, the computer server 830, the cloud storage server 825, the web server 820, and the remote computer 815 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset.

The functions and features described herein may also be executed by various distributed components of a system. For example, one or more processors may execute these system functions, wherein the processors are distributed across multiple components communicating in a network. The distributed components may include one or more client and server machines, which may share processing, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure are defined by the appended claims.

REFERENCE SIGNS LIST

1 Plasma processing apparatus
10 Chamber
10s Internal space
14 Substrate support
16 Electrode plate
18 Lower electrode
20 Electrostatic chuck (ESC)
30 Upper electrode
50 Exhaust device
62 Radio frequency (RF) power supply
64 Bias power supply
80 Controller
CT Controller
EF Etching target layer
MF Mask layer
OP Opening
SC Extension
SS Side surface
TD Deposition layer
TS Upper surface
UF Underlying layer
W Substrate

What is claimed is:

1. A plasma processing method, comprising:
providing a substrate including an etching target layer and a mask layer on an upper surface of the etching target layer, the mask layer having a side surface defining at least one opening on the upper surface of the etching target layer and an extension extending from the side surface to at least a portion of the upper surface of the etching target layer;
forming a deposition layer on at least the side surface of the mask layer; and
at least partially etching the deposition layer using plasma generated from a first process gas to reduce a thickness of the deposition layer,
wherein the first process gas contains a gas for etching the etching target layer, and
wherein the at least partially etching the deposition layer is performed until the etching target layer is partially etched in a depth direction to remove the extension.

2. The plasma processing method according to claim 1, wherein
the forming of the deposition layer on at least the side surface of the mask layer includes forming the deposition layer including a first portion on the side surface of the mask layer and a second portion on an upper surface of the mask layer.

3. The plasma processing method according to claim 2, wherein
in the at least partially etching the deposition layer, the first portion is etched less than the second portion.

4. The plasma processing method according to claim 1, wherein
the at least partially etching the deposition layer includes applying an electrical bias to a substrate support supporting the substrate.

5. The plasma processing method according to claim 1, wherein
the etching target layer includes a silicon-containing layer, the deposition layer includes an organic layer, and the first process gas contains a halogen-containing gas and a gas containing at least one element selected from a group consisting of oxygen, hydrogen, and nitrogen.

6. The plasma processing method according to claim 1, wherein
the etching target layer includes an organic layer, the deposition layer includes a silicon-containing layer, and the first process gas contains a halogen-containing gas and a gas containing at least one element selected from a group consisting of oxygen, hydrogen, and nitrogen.

7. The plasma processing method according to claim 1, wherein
the etching target layer includes a silicon-containing layer, the deposition layer includes a silicon-containing layer, and the first process gas contains a halogen-containing gas.

8. The plasma processing method according to claim 1, wherein
the etching target layer includes an organic layer, the deposition layer includes an organic layer, and the first process gas contains a gas containing at least one element selected from a group consisting of oxygen, hydrogen, and nitrogen.

9. The plasma processing method according to claim 5, wherein
the halogen-containing gas includes a fluorine-containing gas.

10. The plasma processing method according to claim 9, wherein
the fluorine-containing gas includes at least one selected from a group consisting of an $NF_3$ gas, an $SF_6$ gas, an HF gas, and a $C_tH_uF_v$ gas, where t and v are positive integers, and u is an integer greater than or equal to 0.

11. The plasma processing method according to claim 5, wherein
the gas containing at least one element selected from the group consisting of oxygen, hydrogen, and nitrogen includes at least one selected from a group consisting of an $O_2$ gas, an $O_3$ gas, a CO gas, a $CO_2$ gas, an $H_2$ gas, an $H_2O$ gas, an $H_2O_2$ gas, an $NH_3$ gas, and an NO gas.

12. The plasma processing method according to claim 1, wherein
the first process gas contains at least one selected from a group consisting of an HBr gas, an HCl gas, a $Br_2$ gas, a $Cl_2$ gas, and an HI gas.

13. The plasma processing method according to claim 1, wherein
the mask layer includes an organic layer or a silicon-containing layer.

14. The plasma processing method according to claim 1, wherein
the side surface of the mask layer has a recess.

15. The plasma processing method according to claim 1, wherein
the forming of the deposition layer on at least the side surface of the mask layer and the at least partially etching the deposition layer are alternately repeated a plurality of times.

16. The plasma processing method according to claim 1, further comprising:
etching the etching target layer using plasma generated from a second process gas and using the mask layer and the deposition layer as masks.

17. The plasma processing method according to claim 16, wherein
the first process gas and the second process gas contain a same gas.

* * * * *